United States Patent [19]

Simmons, Jr.

[11] Patent Number: 5,381,142
[45] Date of Patent: Jan. 10, 1995

[54] REMOTE CONTROL UNIT HAVING ADDITIONAL KEYS SERVICED VIA AN INTERRUPT

[75] Inventor: Carlton J. Simmons, Jr., Carmel, Ind.

[73] Assignee: Thomson Consumer Electronics, Inc., Indianapolis, Ind.

[21] Appl. No.: 14,102

[22] Filed: Feb. 19, 1993

[51] Int. Cl.$^6$ .............................................. H03K 17/94
[52] U.S. Cl. ...................................... 341/26; 200/5 A
[58] Field of Search .................... 341/26, 22; 200/5 A

[56] References Cited

U.S. PATENT DOCUMENTS 4,591,833  5/1986  Ishii et al. .............................. 341/26

FOREIGN PATENT DOCUMENTS

| 34741  | 3/1980 | Japan | 341/26 |
| 27438  | 3/1981 | Japan | 341/26 |
| 78224  | 5/1983 | Japan | 341/26 |
| 121423 | 7/1984 | Japan | 341/26 |
| 96435  | 4/1990 | Japan | 341/26 |

OTHER PUBLICATIONS

Nixon, "4-By-Matrix Chip Encodes Larger Arrays", *Electronics*, Apr. 1980, vol. 53, No. 10, p. 133.
Buurma et al., "Expand a Keyboard Matrix by Adding Isolation Diodes", *Electronic Design*, Dec. 1978.

*Primary Examiner*—Jeffery A. Hofsass
*Assistant Examiner*—Thomas J. Mullen, Jr.
*Attorney, Agent, or Firm*—Joseph S. Tripoli; Peter M. Emanuel; Thomas F. Lenihan

[57] ABSTRACT

In a remote control unit, a controller is coupled to first and second pluralities of keys for determining which of the keys is depressed at any given time. The first plurality of keys is coupled between a group of drive lines and a group of sense lines. The second plurality of keys is coupled between the sense lines and to an interrupt input port of the controller. A key pressed in the first plurality of keys causes a first kind of interrupt, and a key pressed in the second plurality of keys causes a second kind of interrupt. In response to one of the first and second interrupts, the controller interrogates the keyboard to determine which key is pressed.

8 Claims, 4 Drawing Sheets

REMOTE CONTROL UNIT HAVING ADDITIONAL KEYS SERVICED VIA AN INTERRUPT

FIELD OF THE INVENTION

This invention concerns keyboard circuitry for remote control units, in general, and remote control units having keyboard controllers which are interrupt driven, in particular.

BACKGROUND OF THE INVENTION

In the current highly competitive and cost-conscious television manufacturing environment, it is imperative to ensure that the last full measure of the functional capability of a lower-cost component is obtained before deciding to abandon it in favor of a more functional, but higher cost, component. Remote control units in particular are subject to such restrictions, especially when sold separately, due to their relatively low selling prices. This fact is especially important because microprocessors having many input/output (I/O) ports generally cost more than their counterparts having fewer I/O ports. A suitable controller for a remote control unit is the 68HC05K0 manufactured by Motorola Corp., Phoenix, Ariz. The 68HC05K0 is capable of addressing a keyboard matrix comprising sixteen keys. In some situations, however, sixteen keys are simply not enough, and it is felt that upgrading to a more expensive microprocessor capable of addressing extra keys is an undesirable solution because of the added cost involved.

SUMMARY OF THE INVENTION

In a remote control unit, a controller is coupled to first and second pluralities of keys for determining which of the keys is depressed at any given time. The first plurality of keys is coupled between a group of drive lines and a group of sense lines. The second plurality of keys is coupled between the sense lines and to an interrupt input port of the controller. A key pressed in the first plurality of keys causes a first kind of interrupt, and a key pressed in the second plurality of keys causes a second kind interrupt. In response to one of the first and second interrupts, the controller interrogates the keyboard to determine which key is pressed.

DETAILED DESCRIPTION OF THE DRAWING

Figure 1:
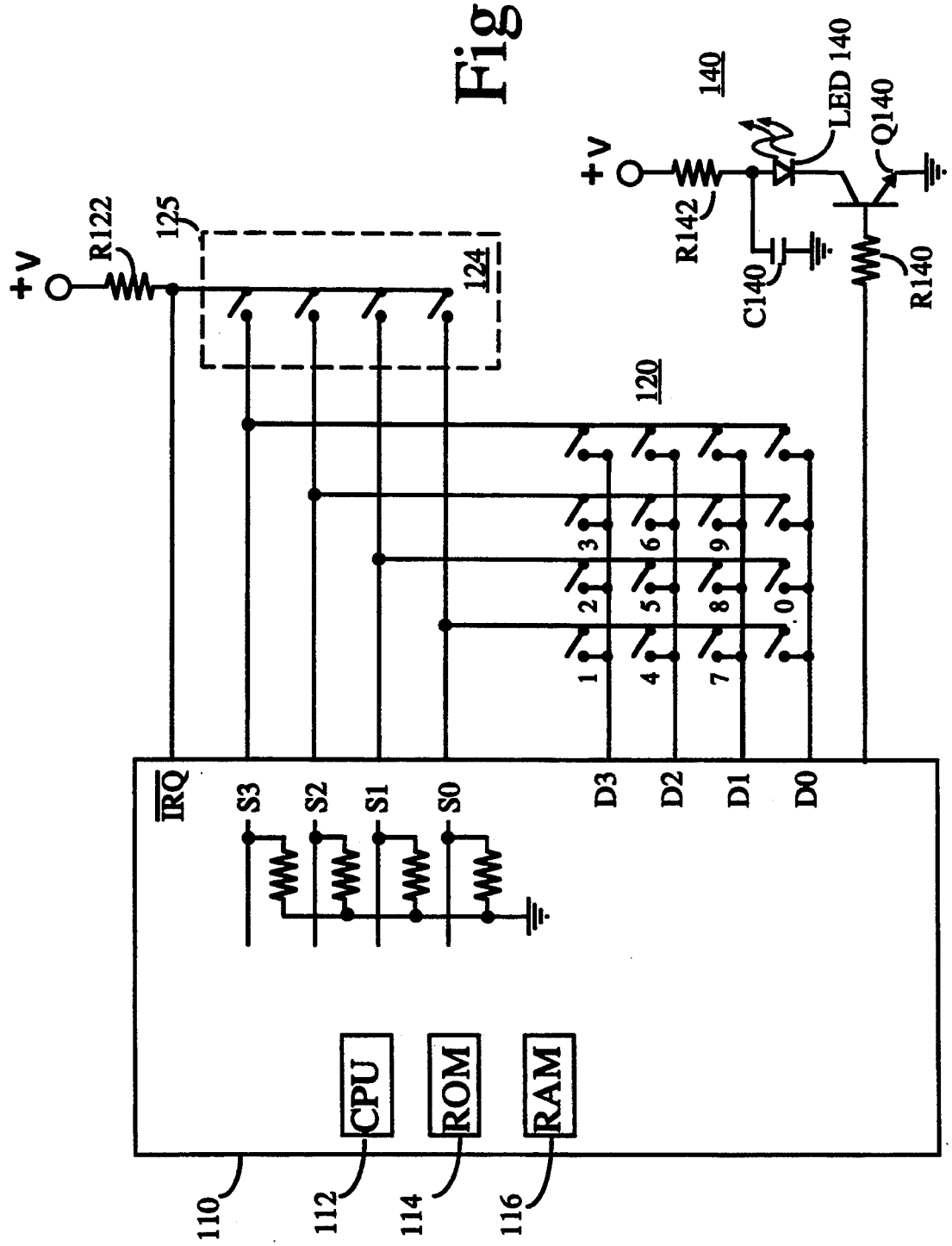
FIG. 1 is an illustration of a remote control unit having a keyboard arranged in accordance with a first embodiment of the invention.

Referring to FIG. 1, a remote control unit includes a microcomputer 110 for reading inputs of a keyboard, generally designated 120, and applying signals to be transmitted to an infrared (IR) LED transmitter arrangement, generally designated 140. The terms "microcomputer", "controller", and "microprocessor", as used herein, are equivalent. It is also recognized that the control function of microcomputer 110 may be performed by an integrated circuit especially manufactured for that specific purpose (i.e., a "custom chip"), and the term "controller", as used herein, is also intended to include such a device. Microcomputer 110 receives user-initiated commands from keyboard 120 which is mounted on the remote control unit. Microcomputer 110 includes a central processing unit (CPU) 112, a program memory (ROM) 114, and includes a random-access memory (RAM) 116. ROM 114 may be either internal to, or external to, microprocessor 110, and may also contain preprogrammed control codes for various equipment of different manufacturers. If so, RAM 116 may be used for expansion of the particular compressed set of control codes selected for each device to be controlled. IR LED transmitter arrangement 140, includes an IR LED designated LED 140, a driver transistor Q140, current-limiting resistors R140 and R142, and a filter capacitor C140.

Keyboard 120 includes, for example, sixteen keys, and has four drive (i.e., input) lines coupled to controller 110 at output ports D0 through D3, and four sense (i.e., output) lines coupled to controller 110 at input ports S0 through S3. In operation, keyboard 120 is scanned by applying a high level (i.e., logic level 1) signal to each of drive lines D0 through D3, in turn. After the high level signal is moved from one drive line to another, each of sense lines S0 through S3 is read to see if a high level signal is present. If so, then one of the keys of keyboard 120 must be down, completing a circuit from the active drive line to the active sense line. Controller 110 can easily determine which key is down because each key affects a unique drive line/sense line pair.

Typical keyboard-scanning software is written such that multiple, concurrent key closures are not permitted, because interpreting which key is desired under such conditions is ambiguous. Consider an example in which keys 1 and 3 are pressed concurrently. When drive line D3 assumes an active high logic level, a high level signal will be applied to sense line S0 through the closed contacts of switch 1, and a high level signal will be applied to sense line S2 through the closed contacts of switch 3. In order to avoid the ambiguity between reading a numeral 1 and a numeral 3, the software would accept only the input from the first active sense line encountered, S0. In so doing, the numeral 1 is entered, the pressing of key 3 is ignored, and the ambiguity is resolved.

A dotted box 125 encompasses an array comprising four additional keys, not driven via drive lines D0 through D3. The operation of this array will be described in detail below.

In order to conserve battery power, it is commonplace for a remote control microprocessor (such as the above-mentioned 68HC05K0) to enter a low-power-consumption, or "sleep" mode when a key has not been pressed for a given period of time, or after completing an IR transmission. The microprocessor is awakened from this "sleep" mode by an interrupt generated when a user presses any key. When microprocessor 110 determines that it is appropriate to enter the sleep mode, it sets bidirectional I/O ports (i.e., sense lines) S0 through S3 to the input mode, applies high level signals to drive lines D0 through D3, enables interrupts and enters the sleep mode. Sense lines S0 through S3 of microprocessor 110 include internal pull-down resistances (shown for simplicity in FIG. 1 as resistors), capable of sinking current in the range of 50 microamps to 200 microamps. Drive lines D0 through D3 are capable of sourcing up to 800 microamps when producing a logic level 1 output. Thus, when switch 1, for example, is closed, a high level signal is applied from drive line D3 to sense line S0 and develops a high level signal across the internal pull-down resistor which is coupled to the S0 input line. The high level signal causes an interrupt which "wakes up" microprocessor 110 from the sleep mode, and causes it to begin a search to identify which key was pressed.

Figure 2:
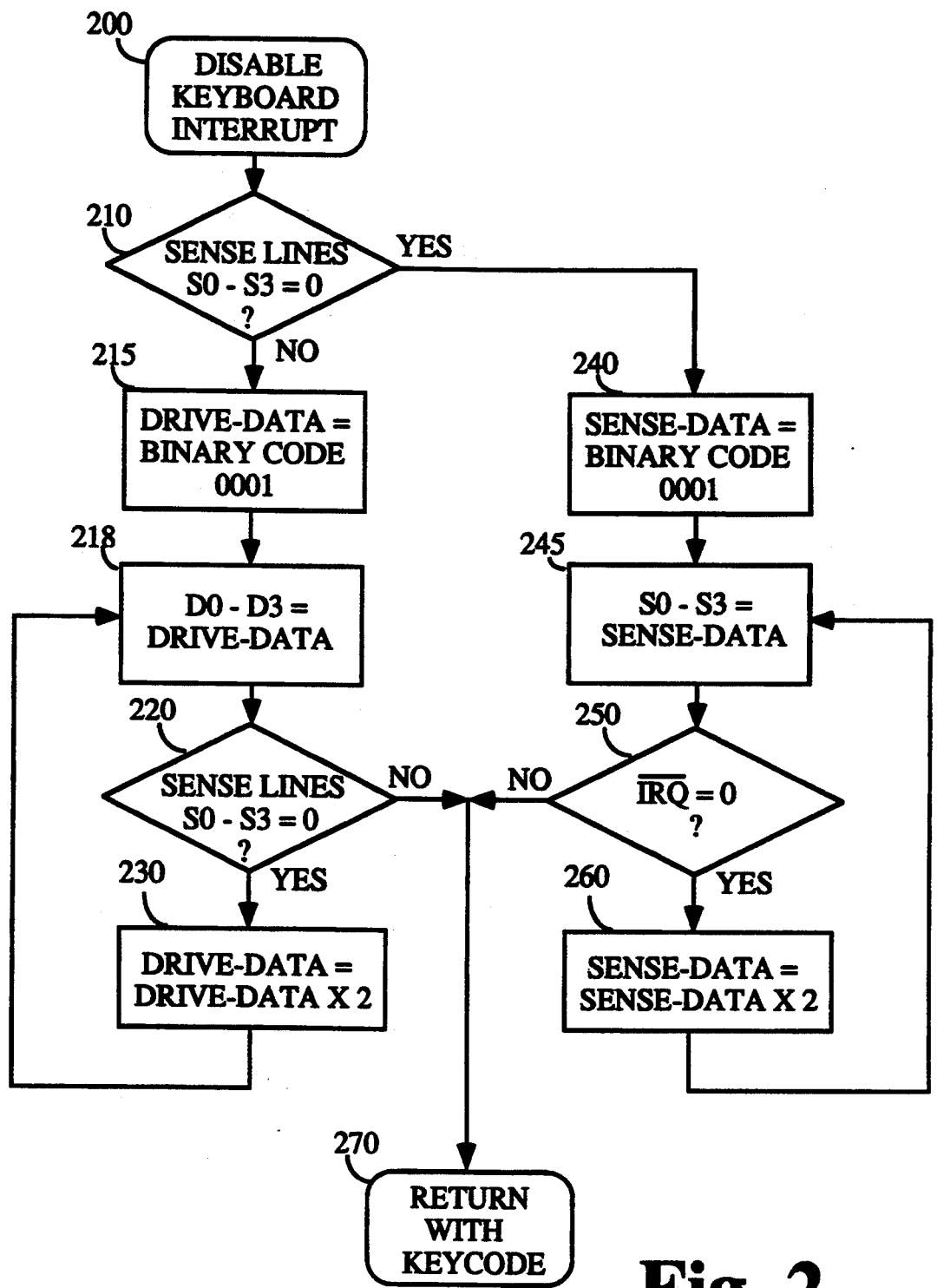
FIG. 2 is an illustration of a simplified flowchart showing a portion of the program code of controller 110 of FIG. 1.

As shown in the flowchart of FIG. 2, the interrupt routine is entered at step 200, where further interrupts are disabled, and it advances to step 210 at which the sense lines S0 through S3 are checked to see if the binary code 0000 is present. If not, a key of keyboard 120 has been pressed, causing that binary code to be other than 0000. In order to determine which key is down, the keyboard matrix is scanned as follows. At step 215, the binary code 0001 is stored in a memory location in RAM 116 labelled DRIVE_DATA. The data in DRIVE_DATA is output to the drive lines D0–D3 at step 218. At step 220, sense lines S0–S3 are again checked for the binary code 0000. If yes, the active switch is not connected to the currently-active drive line, and must be connected to one of the other drive lines. At step 230, the data in DRIVE_DATA is multiplied by 2 (i.e., binary shift left)(which causes the currently active bit to go low and causes the next more significant bit to go high) and the routine loops around to step 218. When, at last, the active key of keyboard matrix 120 is found, the program is exited at step 270.

A first embodiment of the subject invention will now be described with reference to the switch array, generally designated 124, and enclosed within dotted box 125. Note that the switch array 124 is not coupled to the drive lines. Instead, switch array 124 is coupled between sense lines S0–S3 and an interrupt input line "/IRQ". The expression "/IRQ" (read "IRQ BAR") indicates an input for receiving a signal which is "true" when low. Accordingly, input/IRQ is pulled-up to a normally high level by a pull-up resistor R122. If any of the switches of array 124 is pressed, a low level signal will be coupled to the/IRQ input due to the effect of the relatively low-value pull-down resistor associated with the relevant one of sense lines S0–S3. The specifications of the 68HC05K0 microprocessor state that a level no greater than 0.9 volts applied to the/IRQ input will cause an interrupt. Remote control units normally derive operating power from two series-connected 1.5 volt AA or AAA batteries. Thus, in order to ensure that an interrupt is generated, resistor R122 must drop at least 2.1 volts when one of the switches of array 124 is closed. The lowest guaranteed sink current for each of the sense inputs is, as noted above, 50 microamps. Thus, by Ohm's law, the lowest acceptable value for R122 is 42 kilohms. However, an upper value for this resistor is not critical, and therefore a higher value (i.e., more safely away from the lower limit) is more desirable. A good practical value for R122 is 150 kilohms.

FIG. 2 discloses a routine for checking if a switch of switch array 124 is down, and if so, which one. When an interrupt occurs, (either caused by a high level at sense lines S0–S3, or caused by a low level at the/IRQ input), the interrupt routine is entered at step 200, and further interrupts are disabled. At step 210, sense lines S0 through S3 are checked to see if the binary code 0000 is present. If so, a key of keyboard 120 has not been pressed, because such a keypress would cause that binary code to be other than 0000. Thus, a key of array 124 must be down. In order to determine which key of array 124 is down, the array is scanned as follows. At step 240, the binary code 0001 is stored in a memory location in RAM 116 labelled SENSE_DATA. The data in SENSE_DATA is output to the sense lines S0–S3 (i.e., using the sense lines in an output mode) at step 245. At step 250, the/IRQ input is checked for the binary code 0. If yes, the active switch is not connected to the currently-active sense line, and must be connected to one of the other sense lines. At step 260, the data in SENSE_DATA is multiplied by 2 (which causes the currently active bit to go low and causes the next more significant bit to go high) and the routine loops around to step 245. When, at last, the active key of array 124 is found, the program is exited at step 270.

Figure 3:
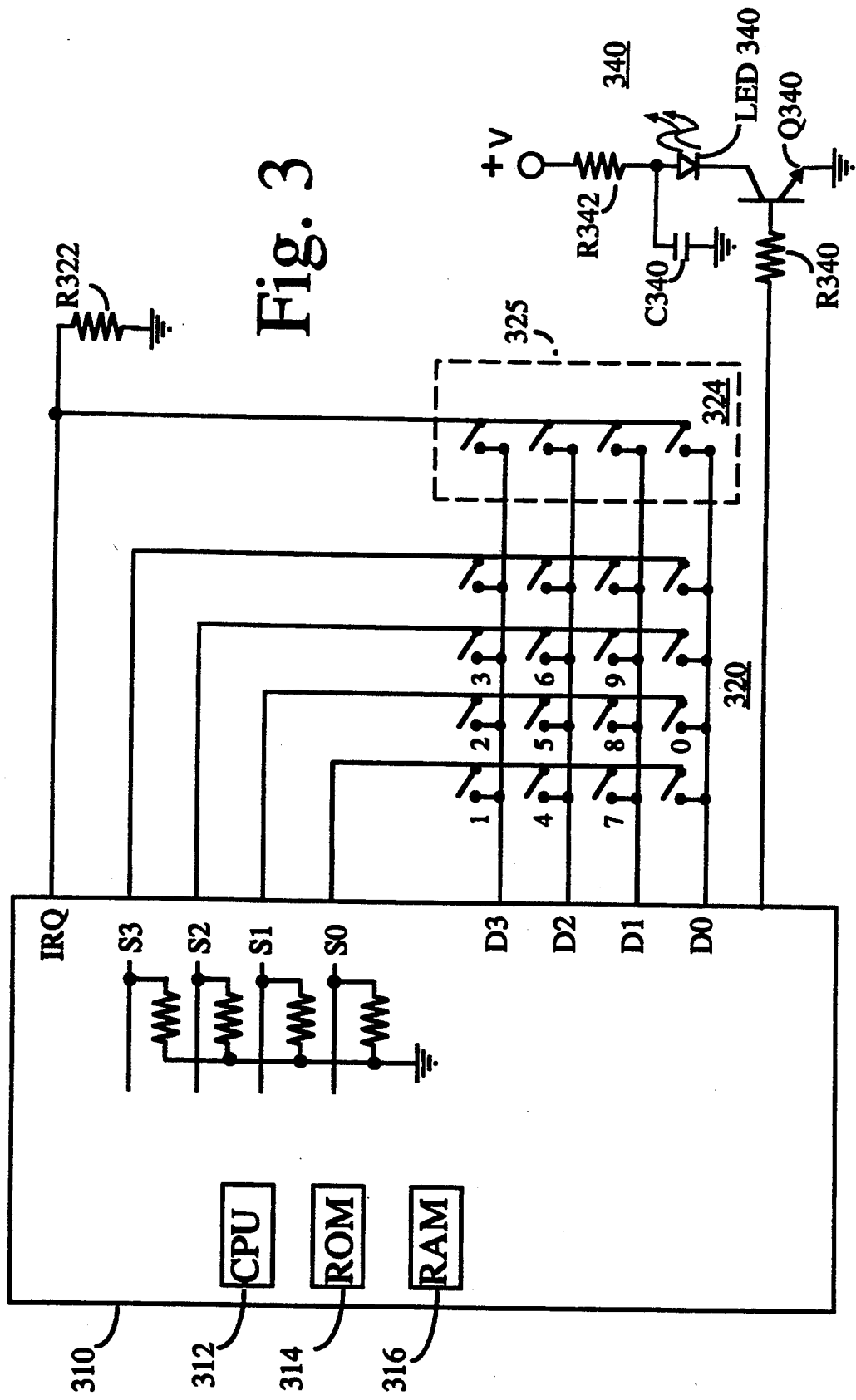
FIG. 3 is an illustration of a remote control unit having a keyboard arranged in accordance with a second embodiment of the invention.

A second embodiment of the subject invention in which a controller having a high-level interrupt input IRQ is shown in FIG. 3, and will now be described with reference to the switch array, generally designated 324, and enclosed within dotted box 325. Elements of FIG. 3 having numbers similar to elements of FIG. 1 have the same function and will not be described again. In this embodiment, switch array 324 is not coupled to the sense lines. Instead, switch array 324 is coupled between drive lines D0–D3 and interrupt input line "IRQ". The expression "IRQ" indicates an input for receiving a signal which is "true" when high. Accordingly, input IRQ is pulled-down to a normally low level by a pull-down resistor R322. If any of the switches of array 324 is pressed, a high level signal will be coupled to the IRQ input due to the high level output of the relevant one of drive lines D0–D3.

Figure 4:
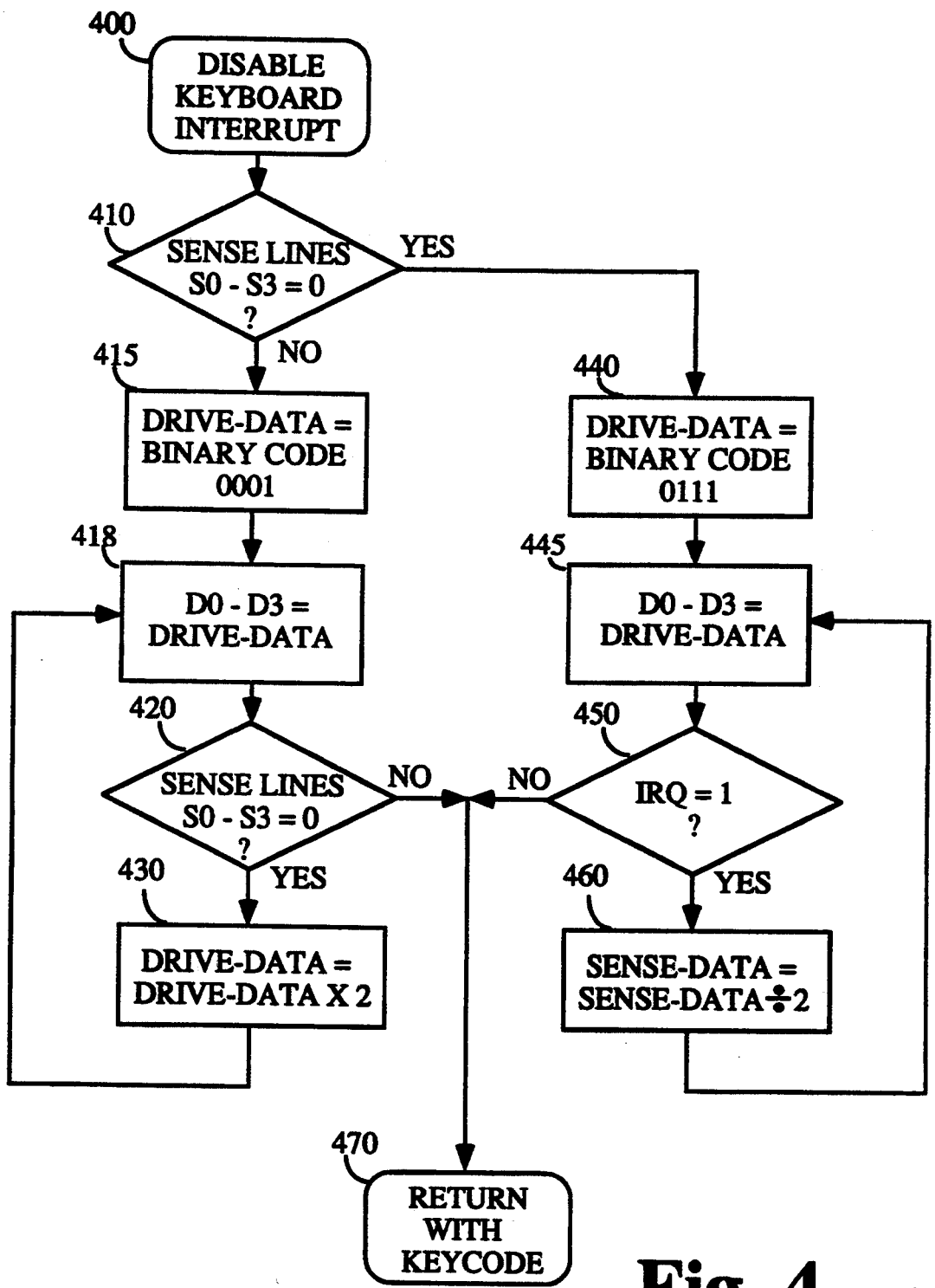
FIG. 4 is an illustration of a simplified flowchart showing a portion of the program code of controller 310 of FIG. 3.

FIG. 4 discloses a routine for checking if a switch of switch array 324 is down, and if so, which one. When an interrupt occurs, (either caused by a high level at sense lines S0–S3, or caused by a high level at the IRQ input), the interrupt routine is entered at step 400, and further interrupts are disabled. At step 410, sense lines S0 through S3 are checked to see if the binary code 0000 is present. If so, a key of keyboard 320 has not been pressed, because such a keypress would cause that binary code to be other than 0000. Thus, a key of array 324 must be down. In order to determine which key of array 324 is down, the array is scanned as follows. At step 340, the binary code 0111 is stored in a memory location in RAM 316 labelled DRIVE_DATA. The data in DRIVE_DATA is output to the drive lines D0–D3 at step 445. At step 450, the IRQ input is checked for the binary code 1. If yes, the active switch is not connected to the currently-active drive line, and must be connected to one of the other drive lines. At step 460, the data in DRIVE_DATA is divided by 2 (which causes the currently active bit to go high and causes the next less significant bit to go low) and the routine loops around to step 445. When, at last, the active key of array 324 is found, the program is exited at step 470.

Thus, an arrangement has been described which accommodates an additional array of switches and satisfies the above-mentioned economic criteria by allowing the use of a less expensive controller and requiring the addition of only a single resistor. Although an IR remote control is shown in the embodiments of FIGS. 1 and 3, one skilled in the art should be aware that the invention is also applicable to remote control units which transmit radio frequency (RF) signals, and such remote control units are deemed to be within the scope of the invention.

What is claimed is:

1. A remote control unit, comprising:
a first plurality of keys arranged in a matrix;
an additional key, not in said matrix; and
a controller coupled to said first plurality of keys and to said additional key for determining which of the keys is pressed;
said controller having a group of drive lines, a group of bidirectional sense lines, and an input terminal for receiving an interrupt signal for causing an interruption of a currently existing mode of operation of said controller;
said first plurality of keys being coupled between said group of drive lines and said group of sense lines;
said additional key being coupled between one of said bidirectional sense lines and said interrupt input terminal;
wherein activation of a key of said first plurality of keys or activation of said additional key causes said interruptions; and,
in response to said interruption, said controller interrogates said first plurality of keys and said additional key to determine which of said keys is pressed.

2. The remote control unit of claim 1, wherein, said sense lines are bidirectional, and one of said drive lines applies a signal having a given polarity to one of said sense lines when one of said first plurality of keys is activated, and one of said sense lines applies a signal of the opposite polarity to said interrupt input terminal when said additional key is activated.

3. A remote control unit, comprising:
a first plurality of keys;
a second plurality of keys; and
a controller coupled to said first and second pluralities of keys for determining which of the keys is pressed;
said controller having a group of drive lines, a group of sense lines, and an input terminal for receiving an interrupt signal for causing an interruption of a currently existing mode of operation of said controller;
said first plurality of keys being coupled between said group of drive lines and said group of sense lines;
said second plurality of keys being coupled between said sense lines and said interrupt input terminal;
wherein activation of a key of said first plurality of keys or activation of said additional key causes said interruption; and,
in response to said interruption, said controller interrogates said first plurality of keys and said additional key to determine which of said keys is pressed.

4. The remote control unit of claim 3, wherein, said sense lines are bidirectional, and one of said drive lines applies a signal having a given polarity to one of said sense lines when one of said first plurality of keys is activated, and one of said sense lines applies a signal of the opposite polarity to said interrupt input terminal when one of said second plurality of keys is activated.

5. A remote control unit, comprising:
a first plurality of keys arranged in a matrix;
an additional key, not in said matrix; and
a controller coupled to said first plurality of keys and to said additional key for determining which of the keys is pressed;
said controller having a group of drive lines, a group of sense lines, and an input terminal for receiving an interrupt signal for causing an interruption of a currently existing mode of operation of said controller;
said first plurality of keys being coupled between said group of drive lines and said group of sense lines;
said additional key being coupled between one of said drive lines and said interrupt input terminal;
wherein activation of a key of said first plurality of keys or activation of said additional key causes said interruption; and,
in response to said interruption, said controller interrogates said first plurality of keys and said additional key to determine which of said keys is pressed.

6. The remote control unit of claim 5, wherein, one of said drive lines applies a signal having a given polarity to one of said sense lines when one of said first plurality of keys is activated, and one of said drive lines applies a signal of the same polarity to said interrupt input terminal when said additional key is activated.

7. A remote control unit, comprising:
a first plurality of keys;
a second plurality of keys; and
a controller coupled to said first and second pluralities of keys for determining which of the keys is pressed;
said controller having a group of drive lines, a group of sense lines, and an input terminal for receiving an interrupt signal for causing an interruption of a currently existing mode of operation of said controller;
said first plurality of keys being coupled between said group of drive lines and said group of sense lines;
said second plurality of keys being coupled between said drive lines and said interrupt input terminal;
wherein activation of a key of said first plurality of keys or activation of said additional key causes said interruption; and,
in response to said interruption, said controller interrogates said first plurality of keys and said additional key to determine which of said keys is pressed.

8. The remote control unit of claim 7, wherein, one of said drive lines applies a signal having a given polarity to one of said sense lines when one of said first plurality of keys is activated, and one of said drive lines applies a signal of the same polarity to said interrupt input terminal when one of said second plurality of keys is activated.

* * * * *